United States Patent
Lu et al.

(10) Patent No.: US 10,135,423 B1
(45) Date of Patent: Nov. 20, 2018

(54) 90 DEGREE HYBRID WITH VARACTOR DIODES FOR LOW LOSS, SIMPLE BIAS AND ZERO POWER CONSUMPTION PHASE SHIFTER

(71) Applicant: HUGHES NETWORK SYSTEMS, LLC, Germantown, MD (US)

(72) Inventors: Bingqian Lu, Germantown, MD (US); Hamad Alsawaha, Germantown, MD (US); Peter Hou, Germantown, MD (US); Thomas Jackson, Germantown, MD (US); Yilin Mao, Germantown, MD (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 0 days.

(21) Appl. No.: 15/801,051

(22) Filed: Nov. 1, 2017

(51) Int. Cl.
| | |
|---|---|
| *H03H 11/20* | (2006.01) |
| *H03K 5/01* | (2006.01) |
| *H04B 1/04* | (2006.01) |
| *H03K 5/00* | (2006.01) |

(52) U.S. Cl.
CPC ............. *H03H 11/20* (2013.01); *H03K 5/01* (2013.01); *H03K 2005/00286* (2013.01); *H04B 1/04* (2013.01)

(58) Field of Classification Search
CPC combination set(s) only.
See application file for complete search history.

(56) References Cited

U.S. PATENT DOCUMENTS

| | | | |
|---|---|---|---|
| 3,963,990 A * | 6/1976 | DiFonzo ................ | H04B 7/002 327/552 |
| 7,969,359 B2 * | 6/2011 | Krishnaswamy ....... | H01P 1/185 342/372 |

* cited by examiner

*Primary Examiner* — An Luu
(74) *Attorney, Agent, or Firm* — Nath, Goldberg & Meyer; Leonid D. Thenor

(57) ABSTRACT

An apparatus and method for continuously shifting the phase of an input signal includes a quadrature hybrid having an input/output port for receiving an input radio frequency (RF) signal and outputting a phase shifted RF signal. An analog shifting unit is connected to the quadrature hybrid for performing an intermediate phase shift on the input RF signal. An additional analog shifting unit is connected to an isolation port of the quadrature hybrid to receive an intermediate output signal based on the intermediate phase shift, and shifting a phase of the intermediate output signal to produce an intermediate input signal. The analog shifting unit performs a final phase shift of the intermediate input signal and the final phase shifted intermediate input signal is output, at the input/output port, as the phase shifted RF signal.

24 Claims, 14 Drawing Sheets

90 DEGREE HYBRID WITH VARACTOR DIODES FOR LOW LOSS, SIMPLE BIAS AND ZERO POWER CONSUMPTION PHASE SHIFTER

BACKGROUND INFORMATION

Phase shifting circuits, or phase shifters, are utilized in a variety of applications and devices to shift the phase of an input signal. For example, the input signal can be a radio frequency (RF) signal or microwave signal that is utilized in a radar system, antenna array, etc. Depending on the specific system and level of complexity, the number of individual phase shifters can exceed tens of thousands.

Phase shifters can be implemented as digital or analog components. Digital phase shifters (or digital shifters) often utilize PIN diodes to select between a limited number of discrete phase shifts that can be applied to the input signal. A PIN diode can be switched on and off by changing its resistance from around 100 kΩ to less than 1Ω. This can be achieved, for example, by altering voltage bias of a PIN diode from forward bias to reverse bias direction, or vice versa. The number of discrete phase shifts is often described in terms of an exponential value based on the number of bits in the digital phase shifter (or digital shifter). For example, a two-bit digital shifter would be represented as $2^n$, where n is the number of bits, thus providing a total of 4 possible states. Similarly, a three-bit digital shifter would provide 8 discrete states (i.e., $2^3$=8), a four-bit digital shifter would provide 16 discrete states (i.e., $2^4$=16), a five-bit digital shifter would provide 32 states (i.e., $2^5$=32), etc. A three-bit digital filter with a 360° range could, for example, implement the following discrete states (or phase shifts): 45°, 90°, 135°, 180°, 225°, 270°, 315°, and 360°.

Digital shifters, however, have several drawbacks. The resolution is limited because number states are discrete. Using the above example, phase shifts ranging from 46° to 89° are not possible. Digital shifters are also current controlled components that typically require about 10 mA per diode. In applications that require tens of thousands of 3-bit digital filters, the total current consumed at 5V can exceed 1 KW. In complex antenna configurations that require tens of thousands of digital shifters, the power requirements can result in heating and thermal interference problems. Digital shifters also have an insertion loss that increases with the number of bits and with frequency increases. In the Ka band, for example a four-bit digital shifter has an insertion loss of around −3.2 dB and a six-bit digital shifter has an insertion loss of −5.2 dB. Such losses can be intolerable for efficiency sensitive systems.

Analog phase shifters (or analog shifters) often utilize a varactor diode (or simply varactor) to provide continuous phase shifts within a particular range. Varactors operate in a reverse biased condition providing a junction capacitance that varies based on applied voltage. The phase shift can be changed continuously with control input, thereby providing unlimited resolution with monotonic performance. Unlike digital shifters, an analog shifter could provide continuous phase shifts from 45° to 90° with a high level of precision (e.g., 45.00001°, 45.0001°, 45.001°, etc.), based on the applied voltage increments. Varactors are also voltage controlled components with minimal (or negligible) power requirements.

There are several drawbacks associated with analog shifters. Varactors have a breakdown voltage and their variable junction capacitance is limited by the breakdown voltage. This results in limited range of phases that can be covered (up to about 100°). Thus, sufficient phase shifts cannot be provided to cover the full 360° range without excessive signal loss.

Based on the foregoing, there is a need for an approach for providing continuous phase shifts over the full 360° range with minimal insertion loss and minimal power requirements.

BRIEF SUMMARY

An apparatus and method are disclosed for shifting the phase of an input signal continuously and with infinite resolution. According to an embodiment, the apparatus includes a quadrature hybrid having an input/output port configured, in part, for receiving an input radio frequency (RF) signal from an external source and outputting a phase shifted RF signal; an analog shifting unit connected to the quadrature hybrid for performing an intermediate phase shift on the input RF signal within a predetermined range; and an additional analog shifting unit connected to an isolation port of the quadrature hybrid, the additional analog shifting unit being configured for: receiving, at the isolation port of the quadrature hybrid, an intermediate output signal based, at least in part, on the intermediate phase shift, shifting a phase of the intermediate output signal received at the isolation port within a predetermined range to produce an intermediate input signal, and supplying the intermediate input signal to the isolation port of the quadrature hybrid, wherein the analog shifting unit is configured to perform a final phase shift of the intermediate input signal within a predetermined range, and wherein the final phase shifted intermediate input signal is output, at the input/output port, as the phase shifted RF signal.

According to another embodiment, the method includes receiving an input radio frequency (RF) signal from an external source at an input/output port of a quadrature hybrid; performing an intermediate phase shift of the input RF signal using a first analog shifting unit; receiving, at an isolation port of the quadrature hybrid, an intermediate output signal based, at least in part, on the intermediate phase shift; shifting a phase of the intermediate output signal within a predetermined range to produce an intermediate input signal using an additional analog shifting unit connected to the isolation port of the quadrature hybrid; supplying the intermediate input signal to the isolation port of the quadrature hybrid; performing a final phase shift of the intermediate input signal using the first analog shifting unit; and outputting, at the input/output port, a phase shifted RF signal corresponding to the final phase shifted intermediate input signal, wherein the intermediate phase shift and the final phase shift are variable within a predetermined range.

The foregoing summary is only intended to provide a brief introduction to selected features that are described in greater detail below in the detailed description. As such, this summary is not intended to identify, represent, or highlight features believed to be key or essential to the claimed subject matter. Furthermore, this summary is not intended to be used as an aid in determining the scope of the claimed subject matter.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION

An apparatus and method for continuously shifting the phase of an input signal with infinite resolution, is described. In the following description, for purposes of explanation, numerous specific details are set forth in order to provide a thorough understanding of the disclosed embodiments. It will become apparent, however, to one skilled in the art that various embodiments may be practiced without these specific details or with an equivalent arrangement. In other instances, well-known structures and devices are shown in block diagram form in order to avoid unnecessarily obscuring the various embodiments.

Figure 1:
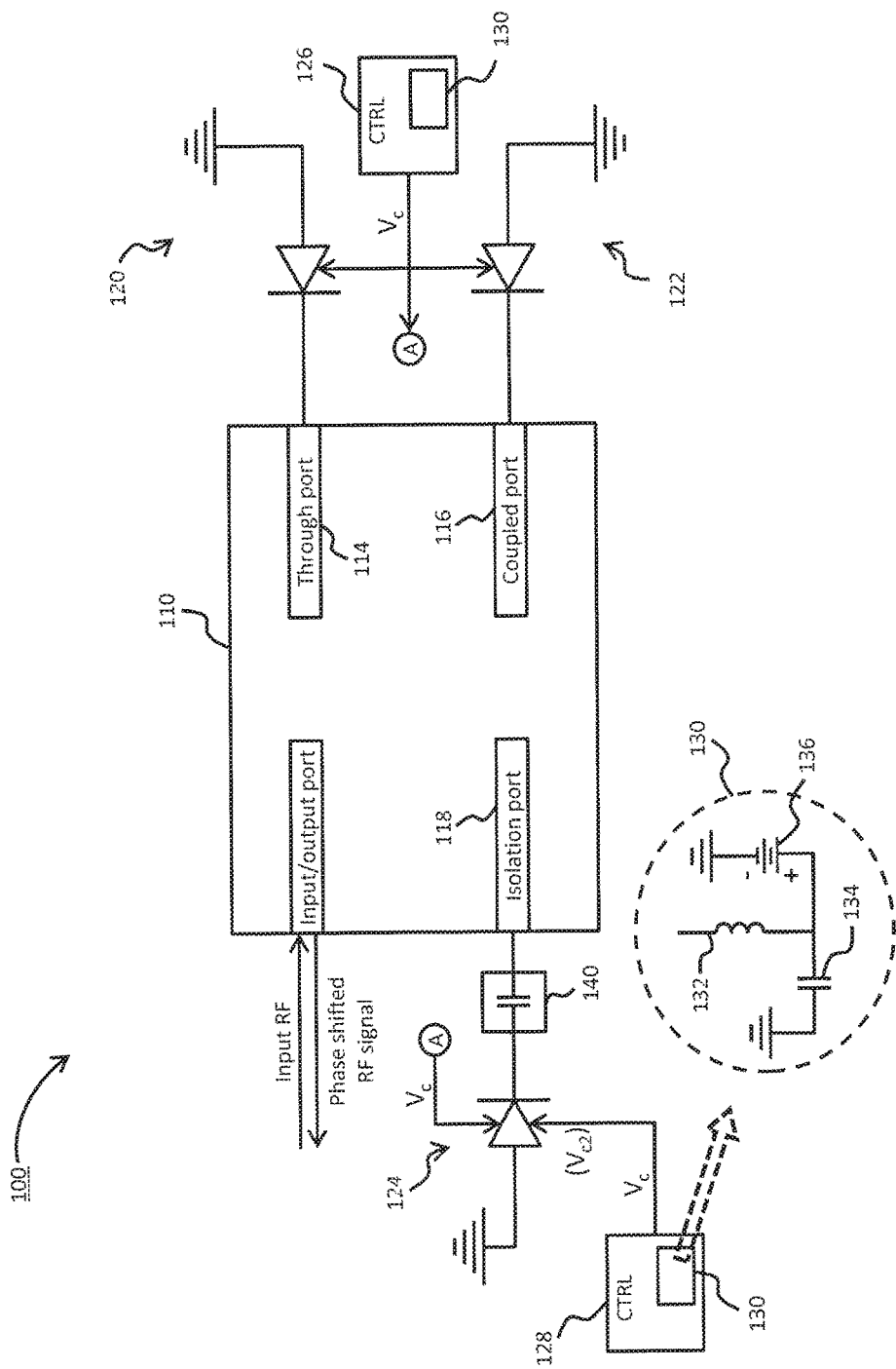
FIG. 1 is a diagram of a hybrid-analog phase shifter, according to at least one embodiment.

FIG. 1 is a diagram of a hybrid-analog phase shifter 100, according to at least one embodiment. The hybrid-analog shifter 100 includes quadrature hybrid 110 and a plurality of analog shifters. According to the illustrated embodiment, hybrid-analog shifter 100 utilizes a hybrid coupler such as the quadrature hybrid 110, also known as a 90° hybrid. The quadrature hybrid 110 includes an input/output port 112, a through port 114, a coupled port 116, and an isolation port 118. Although not shown in FIG. 1, the quadrature hybrid 110 includes multiple phase delay loads, such as λ/4 transmission lines. The λ/4 transmission lines can generate, for example, a 90° phase difference between the input/output port 112 and the through port 114, and between the through port 114 and the coupled port 116 when an input signal is supplied at the input/output port 112. The quadrature hybrid 110 is configured such that the input/output port 112 receives an input radio frequency (RF) signal, and outputs a phase shifted RF signal.

According to the illustrated embodiment, three analog shifters are connected to outputs of the quadrature hybrid 110. Specifically, a first analog shifter 120 is connected to the through port 114, a second analog shifter 122 is connected to the coupled port 116, and a third analog shifter 124 is connected to the isolation port 118. The first analog shifter 120, the second analog shifter 122, and the third analog shifter 124 are each grounded. According to at least one embodiment, the analog shifters (120, 122, 124) can be configured as varactors whose capacitance can be adjusted based on a control voltage $V_c$. Varactors operate under reverse bias conditions, thereby eliminating the need for dedicated current (i.e., power). While unintentional current leakage may occur, such leakage typically amounts to less than 100 nA. An exemplary phased array antenna having 80,000 phase shifters would consume a total of 12,000 W when using digital shifters incorporating 3-bit diodes. Such an antenna would further require elaborate and expensive designs to dissipate the heat generated from the power supply. In contrast, an implementation which incorporates various embodiments of the hybrid-analog phase shifter 100 would consume a maximum of 0.09 W at 12V.

According to various embodiments, a voltage controller 126 can be utilized to supply a control voltage $V_c$ to each varactor in order to vary its junction capacitance. As illustrated in FIG. 1, for example, the voltage controller 126 can supply the control voltage $V_c$ to the first analog shifter 120, the second analog shifter 122, and the third analog shifter (via flow point A). According to other embodiments, each varactor can receive its control voltage ($V_c$) from a separate voltage controller. Furthermore, a second voltage controller 128 can be used to supply the control voltage $V_c$ or a second control voltage $V_{c2}$ to the third analog shifter 124. Thus, continuous phase changes to the input signal can be achieved relative to the voltage being supplied by the voltage controller 126. Depending on the specific implementation, the resolution of the analog shifter 120 can be finely tuned to achieve very precise phase shifts for the input signal. If the total voltage range of the voltage controller is 1V-10V, for example, adjustments can be made by increments of 0.1V, 0.01V, 0.001V, etc. Very fine incremental changes can, therefore, be achieved by the analog shifters (120, 122, 124) as the phase of the input RF signal is continuously shifted.

The voltage controllers (126, 128) can be configured, at least in part, to incorporate a DC bias circuit 130. In embodiments that utilize a single voltage controller 126 is used to supply the control voltage to all three analog shifters (120, 122, 124), a single bias circuit 130 can be provided within the voltage controller 126. The bias circuit 130 can include an inductor functioning as an RF choke 132, and a bypass capacitor 134 adjacent to a DC voltage source 136. Embodiments incorporating a second voltage controller 128 to supply a second control voltage $V_{c2}$ to the third analog shifter 124 can also include a bias circuit 130. Additionally, a DC block 140 can be utilized to prevent the third analog shifter 124 from receiving the control voltage ($V_c$) from the voltage controller 126. According to various implementations, the RF choke 132 can be constructed as a high impedance transmission line having λ/4 phase delay, while a low impedance open transmission line stub having λ/4 phase delay can be used as the bypass capacitor.

According to the illustrated embodiment, the first analog shifter 120 and the second analog shifter 122 are configured to provide a first phase shift range, while the third analog shifter 124 is configured to provide a second phase shift range. The two phase shift ranges are combined such that the phase of the input RF signal can be continuously adjusted over a full 360° range. Depending on the specific configuration, however, the phase range can be adjusted such that it is less than 360° (e.g., 345°) or greater than 360° (e.g., 375°). Additionally, the 90° phase difference between the through port 114 and the coupled port 116 can reduce reflections from the first analog shifter 120 and the second analog shifter 122. As previously discussed, the hybrid-analog shifter 100 can be configured such that the first analog shifter 120 and the second analog shifter 122 receive the same control voltage $V_c$. Such a feature results in cancellation of partial reflections because they will be 180 out of phase with the phase from the first analog shifter 120 and the second analog shifter 122. More particularly, the partial reflection from the first analog shifter 120 will be 180° out of phase with the phase of the second analog shifter 122, and vice versa.

Figure 2A:
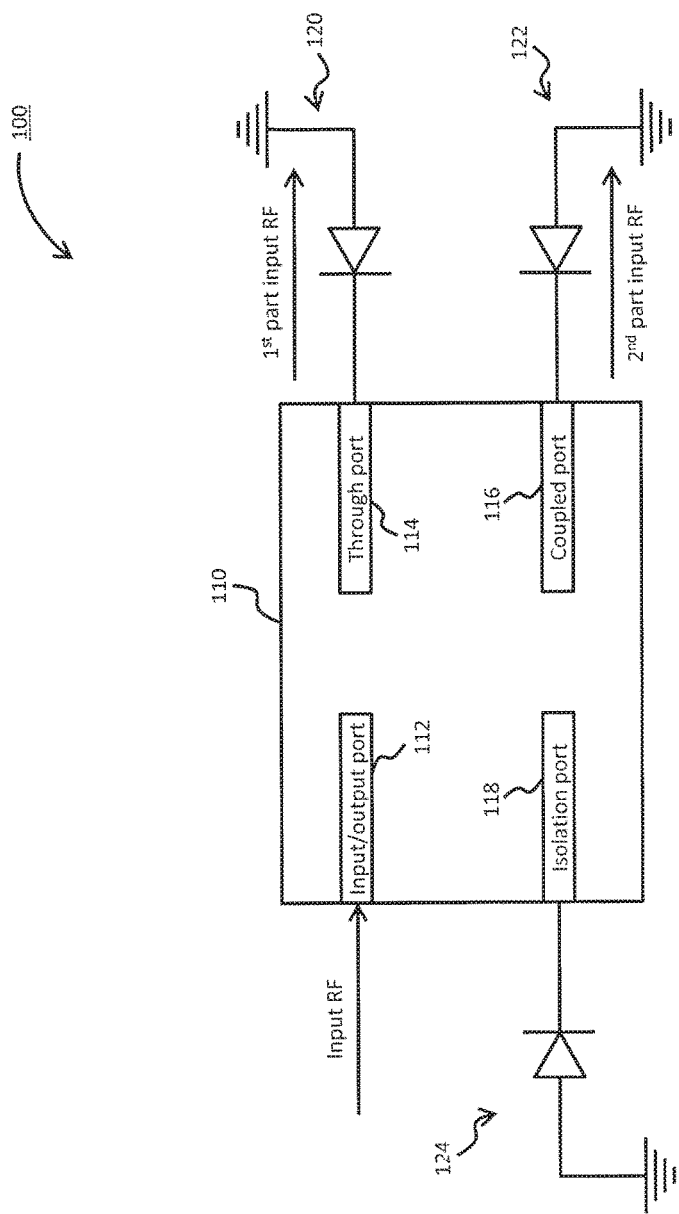
FIG. 2A is a diagram of the hybrid-analog phase shifter of FIG. 1 at a first point in the phase shifting process, according to one embodiment.

FIG. 2A is a diagram of the hybrid-analog phase shifter 100 of FIG. 1 at a first point in the phase shifting process. According to the illustrated embodiment, an input RF signal is received at the input/output port 112 of the quadrature hybrid 110. The input RF signal is split equally into a first portion and a second portion. The first portion is supplied to the through port 114, while a second portion is supplied to the coupled port 116. Due to the phase delay loads present within the quadrature hybrid 110, the first portion of the input RF signal has a 90° phase shift and the second portion of the input RF signal has a 180° phase shift. According to a specific implementation, if an input signal (a) with zero phase is received at the input/output port 112, the signals received at the through port 114 and the coupled port 116 can be respectively represented as:

$$\frac{1}{\sqrt{2}} a e^{-j\frac{\pi}{2}}$$

$$\frac{1}{\sqrt{2}} a e^{-j\pi}$$

Figure 2B:
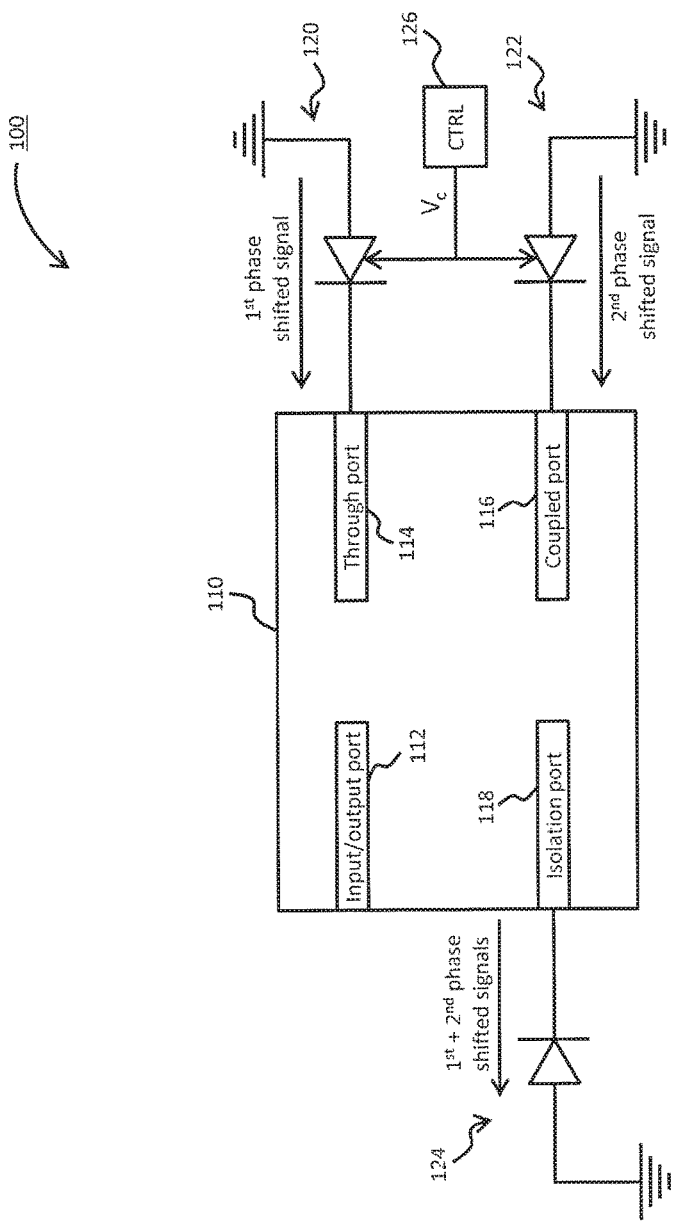
FIG. 2B is a diagram of the hybrid-analog phase shifter of FIG. 1 at a second point in the phase shifting process, according to one embodiment.

FIG. 2B is a diagram of the hybrid-analog phase shifter 100 at a second point in the phase shifting process. The first analog shifter 120 is configured to shift the phase of the first portion of the input RF signal over a phase shift value that is continuously variable within a predetermined range. Thus, any particular phase shift value can be selected from the predetermined range. Furthermore, values can be selected with infinite resolution. A first phase shifted signal is generated from the phase shift applied to the first portion of the input RF signal.

Similarly, the second analog shifter 122 is configured to shift the second portion of the input RF signal over a phase range that is continuously variable within a predetermined range. This results in a second phase shifted signal. According to at least one embodiment, the controller 126 supplies a control voltage $V_c$ to both the first analog shifter 120 and the second analog shifter 122. The first and second portions of the input RF signal, therefore, receive the same amount of phase shift. According to embodiments where the hybrid-analog shifter 100 is configured to utilize different control voltages, however, the controller 126 can be configured to supply a first control voltage $V_c$ to the first analog shifter 120 and the second analog shifter 122. As will be discussed in greater detail below, the hybrid-analog shifter 100 can be configured such that the third analog shifter 124 receives a different control voltage.

According to a specific implementation, the first phase shifted signal the second phase shifted signal can be respectively represented as:

$$\frac{1}{\sqrt{2}} a e^{-j(\frac{\pi}{2}+\phi_1)}$$

$$\frac{1}{\sqrt{2}} a e^{-j(\pi+\phi_1)}$$

where $\phi_1$ is the phase change resulting from the first and second analog shifters.

The first phase shifted signal is returned to the through port 114, and split into two portions such that the first portion is supplied to the input/output port 112 and the second portion is supplied to the isolation port 118. The second phase shifted signal is similarly returned to the coupled port 116 and split such that the first portion is supplied to the isolation port 118 and the second portion is supplied to the input/output port 112. The first and second phase shifted signals experience a further phase shift as they pass through the internal phase delay loads. The signal received at the input/output port 112 has a first component corresponding to the first phase shifted signal received at the through port 114, and a second component corresponding to the second phase shifted signal received at the coupled port 116. Since the first analog shifter 120 and the second analog 122 are controlled to generate the same amount of phase shift ($\phi_1$), the two components of the signal received at the input/output port 112 cancel each other out. The following equation represents the signal received at the input/output port 112:

$$\frac{1}{\sqrt{2}} a e^{-j(\frac{\pi}{2}+\phi_1)} \left(\frac{1}{\sqrt{2}}\right) e^{-\frac{j\pi}{2}} + \frac{1}{\sqrt{2}} a e^{-j(\pi+\phi_1)} \left(\frac{1}{\sqrt{2}}\right) e^{-j\pi} = 0$$

The signal received at the isolation port 118 has a first component corresponding to the first phase shifted signal received at the through port 114, and a second component corresponding to the second phase shifted signal received at the coupled port 116. As previously discussed, the signals received at the isolation port 118 are also subject to phase delays resulting from the internal phase delay loads of the quadrature hybrid 110. The first and second components of the signal received at the isolation port 118, however, do not cancel each other out. Rather, they result in an intermediate output signal when combined. The following equation represents the signal received at the isolation port 118:

$$\frac{1}{\sqrt{2}} a e^{-j(\frac{\pi}{2}+\phi_1)} \left(\frac{1}{\sqrt{2}}\right) e^{-j\pi} + \frac{1}{\sqrt{2}} a e^{-j(\pi+\phi_1)} \left(\frac{1}{\sqrt{2}}\right) e^{-\frac{j\pi}{2}} = a e^{-j(\pi+\frac{\pi}{2}+\phi_1)}$$

Figure 2C:
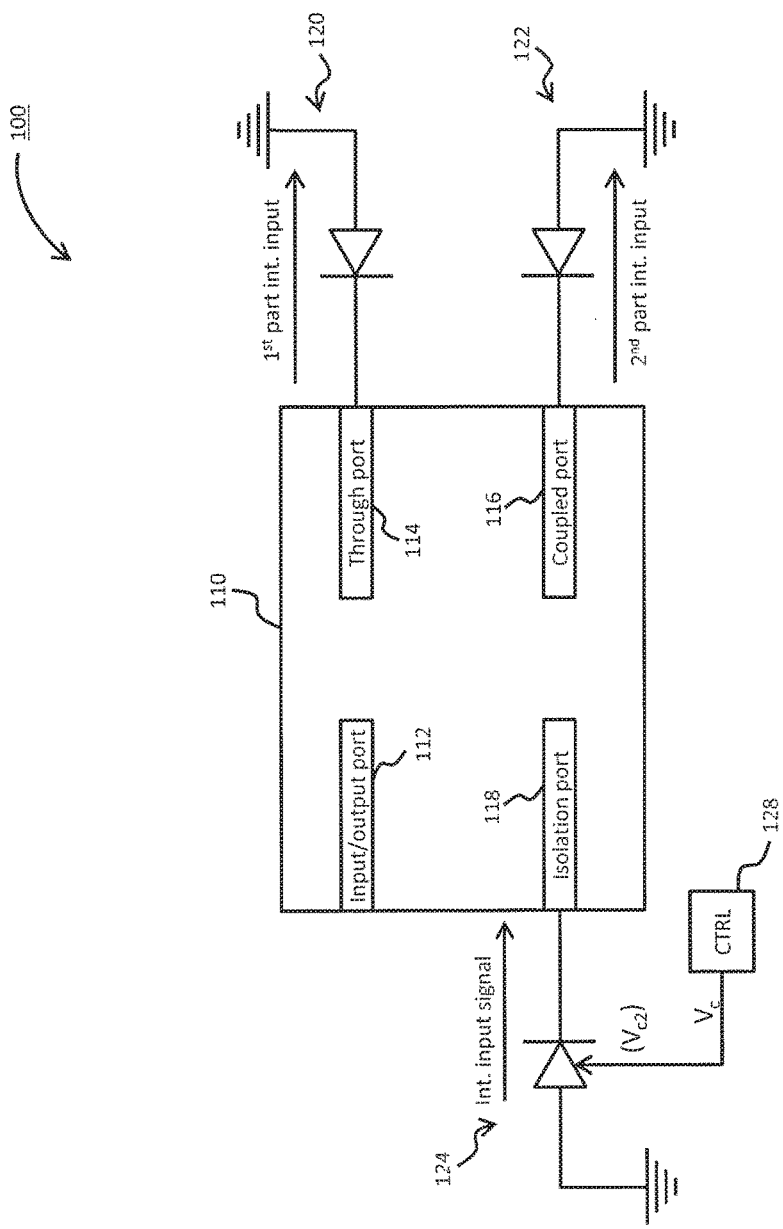
FIG. 2C is a diagram of the hybrid-analog phase shifter of FIG. 1 at a third point in the phase shifting process, according to one embodiment.

FIG. 2C is a diagram of the hybrid-analog phase shifter 100 at a third point in the phase shifting process. According to the illustrated embodiment, the third analog shifter 124 is configured to variably shift the phase of the intermediate output signal within a predetermined range. This results in an intermediate input signal having a phase range that is continuously variable based, at least in part, on the applied control voltage $V_c$. The intermediate input signal can be represented by the following equation:

$$a e^{-j(\pi+\frac{\pi}{2}+\phi_1+\phi_2)}$$

where: $\phi_1$ is the phase change resulting from the first analog shifter and/or the second analog shifter, and $\phi_2$ is the phase change resulting from the third analog shifter.

According to at least one embodiment, the second controller 128 can be used to supply the same control voltage $V_c$ (from controller 126) to the third analog shifter 124. According to other embodiments, however, controller 126 can be configured to supply a first control voltage $V_c$, and the second controller 128 can be configured to supply a second control voltage $V_{c2}$, that differs from $V_c$, to the third analog shifter 124.

The intermediate input signal is received at the isolation port 118 of the quadrature hybrid 110. The intermediate input signal is split, and a first portion is supplied to the through port 114 and a second portion is supplied to the coupled port 116. The signals received at the through port 114 and the coupled port 116 are further subjected to phase delays resulting from the internal phase delay loads of the quadrature hybrid 110. The first and second portions of the intermediate input signal can be respectively represented by the following equations:

$$\frac{1}{\sqrt{2}} a e^{-j(\frac{\pi}{2}+\phi_1+\phi_2)}$$

$$\frac{1}{\sqrt{2}} a e^{-j(\phi_1+\phi_2)}$$

Figure 2D:
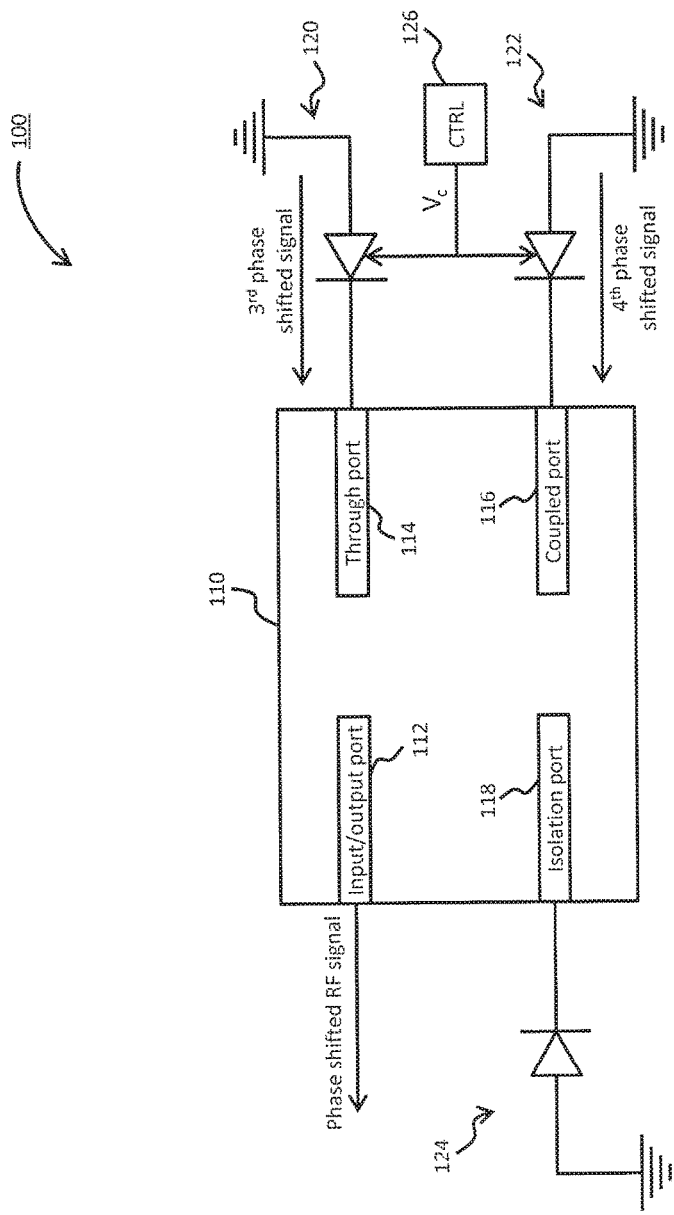
FIG. 2D is a diagram of the hybrid-analog phase shifter of FIG. 1 at a final point in the phase shifting process, according to one embodiment.

Referring to FIG. 2D, the first analog shifter 120 shifts the first portion of the intermediate input signal by a phase shift value that is continuously variable within a predetermined range. This results in a third phase shifted signal. The second analog shifter 122 shifts the second portion of the input RF signal by a phase shift value that is continuously variable within a predetermined range. This results in a fourth phase shifted signal. According to the illustrated embodiment, the controller 126 supplies the same control voltage $V_c$ to both the first analog shifter 120 and the second analog shifter 122 in order to generate the same amount of phase shift. The control voltage $V_c$ can also be selected to provide a phase shift which differs from that of the first and second phase shifted signals. Thus, a first control (e.g., $V_c$) voltage can be selected to provide identical phase shift values to the first analog shifter 120 and the second analog shifter 122 in order to generate the first and second phase shifted signals, and a second control voltage (e.g., $V_{c2}$) can be selected to provide identical phase shift values to the first analog shifter 120 and the second analog shifter 122 in order to generate the third and fourth phase shifted signals. The third and fourth phase shifted signals can be represented by the following equations:

$$\frac{1}{\sqrt{2}} a e^{-j(\frac{\pi}{2}+2\phi_1+\phi_2)}$$

$$\frac{1}{\sqrt{2}} a e^{-j(2\phi_1+\phi_2)}$$

As previously discussed, $\phi_1$ represents the phase changes resulting from the first and second analog shifters, and $\phi_2$ represents the phase change resulting from the third analog shifter.

The third phase shifted signal is returned to the through port 114 and split into two portions. The first portion is supplied to the input/output port 112 and the second portion is supplied to the isolation port 118. Furthermore, the fourth phase shifted signal is returned to the coupled port 116 and split such that a first portion is supplied to the isolation port 118 and a second portion is supplied to the input/output port 112. The third and fourth phase shifted signals experience additional phase shifts as they pass through the internal phase delay loads of the quadrature hybrid 110.

The signal received at the isolation port 118 has a first component corresponding to the third phase shifted signal received at the through port 114, and a second component corresponding to the fourth phase shifted signal received at the coupled port 116. According to the illustrated embodiment, the first analog shifter 120 and the second analog 122 are controlled to generate the same phase shift ($\phi_1$). Thus, the two components of the signal received at the isolation port 118 cancel each other out. The following equation represents the signal received at the isolation port 118:

$$\frac{1}{\sqrt{2}} a e^{-j(\frac{\pi}{2}+2\phi_1+\phi_2)}\left(\frac{1}{\sqrt{2}}\right)e^{-j\pi} + \frac{1}{\sqrt{2}} a e^{-j(2\phi_1+\phi_2)}\left(\frac{1}{\sqrt{2}}\right)e^{-j(\frac{\pi}{2})} = 0$$

The signal received at the input/output port 112 also has a first component corresponding to the third phase shifted signal received at the through port 114, and a second component corresponding to the fourth phase shifted signal received at the coupled port 116. The first and second components of the signal received at the input/output port 112, however, do not cancel each other out. Rather, they form the phase shifted RF signal when combined. The following equation represents the signal received at the input/output port 112:

$$\frac{1}{\sqrt{2}} a e^{-j(\frac{\pi}{2}+2\phi_1+\phi_2)}\left(\frac{1}{\sqrt{2}}\right)e^{-\frac{j\pi}{2}} + \frac{1}{\sqrt{2}} a e^{-j(2\phi_1+\phi_2)}\left(\frac{1}{\sqrt{2}}\right)e^{-j(\pi)} =$$

$$a e^{-j(\pi+2\phi_1+\phi_2)}$$

The phase shifted RF signal, therefore, contains phase shift values resulting from the first analog shifter 120 ($\phi_1$), the second analog shifter 122 ($\phi_1$), and the third analog shifter 124 ($\phi_2$).

Figure 3:
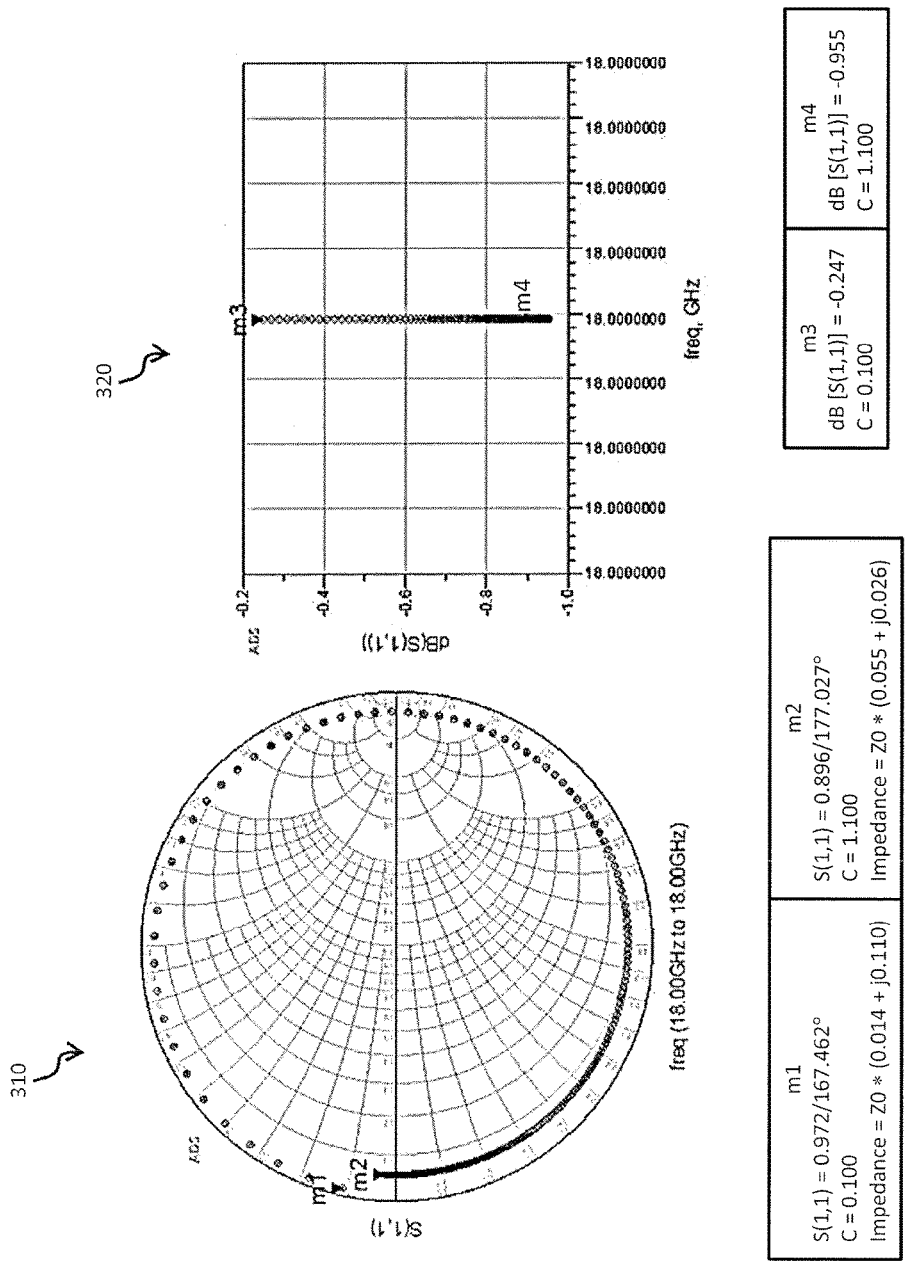
FIG. 3 is a diagram of a phase range and signal loss achieved by the hybrid-analog phase shifter of FIG. 1, according to various embodiments.

FIG. 3 is a diagram of a phase range and signal loss achievable by the hybrid-analog phase shifter 100, according to one or more embodiments. As illustrated in the phase range plot 310 and corresponding signal loss plot 320, the input RF signal is selected to be 18.00 GHz, and the first, second, and third analog shifters (120, 122, 124) are configured as varactors. The quadrature hybrid 100 is also configured to incorporate ideal transmission lines (i.e., 18 GHz). According to the illustrated embodiment, the voltage controller 126 supplies a control voltage $V_c$ to the varactors 120, 122, 124 in order to vary their junction capacitance from C=0.100 pF to 1.100 pF. At point m1, the junction capacitance is C=0.100 pF, and a phase shift of 167.462° is achieved. As the control voltage $V_c$ is adjusted to achieve a junction capacitance of C=1.100 pF at point m2, the phase shift continuously changes clockwise to a final value of 177.027°. As further illustrated in the signal loss plot 320, the signal loss within the phase shift range varies from −0.247 dB at point m3 to −0.955 dB at point m4.

As illustrated in the phase range plot 310, the control voltage $V_c$ covers almost a full 360°. Various techniques can be used to compensate for the missing range of approximately 10°. Depending on the specific implementation, for example, phase shifts in the range of 167.462° to 177.027° may not be necessary or desired. If phase shifts are desired within this range, however, various parameters can be adjusted to increase or decrease the existing phase range. For example, the phase range can be increased by lowering the characteristic impedance ($Z_O$) of the quadrature hybrid 110 from 50Ω (in the illustrated embodiments) to 1Ω. It should be noted that any value between 1Ω-50Ω can be selected. Conversely, the phase range can be decreased by increasing the characteristic impedance ($Z_O$) of the quadrature hybrid 110 from 50Ω to 100Ω. Additionally, the phase range can be adjusted by utilizing smaller varactors whose junction capacitance can be varied, for example, between 0.02 pF-0.22 pF. Multiple varactors can also be connected in parallel within the analog shifters. As further described with respect to FIG. 4, for example, the frequency of the input signal can also be increased or decreased in order to increase or decrease the resulting phase range.

Figure 4A:
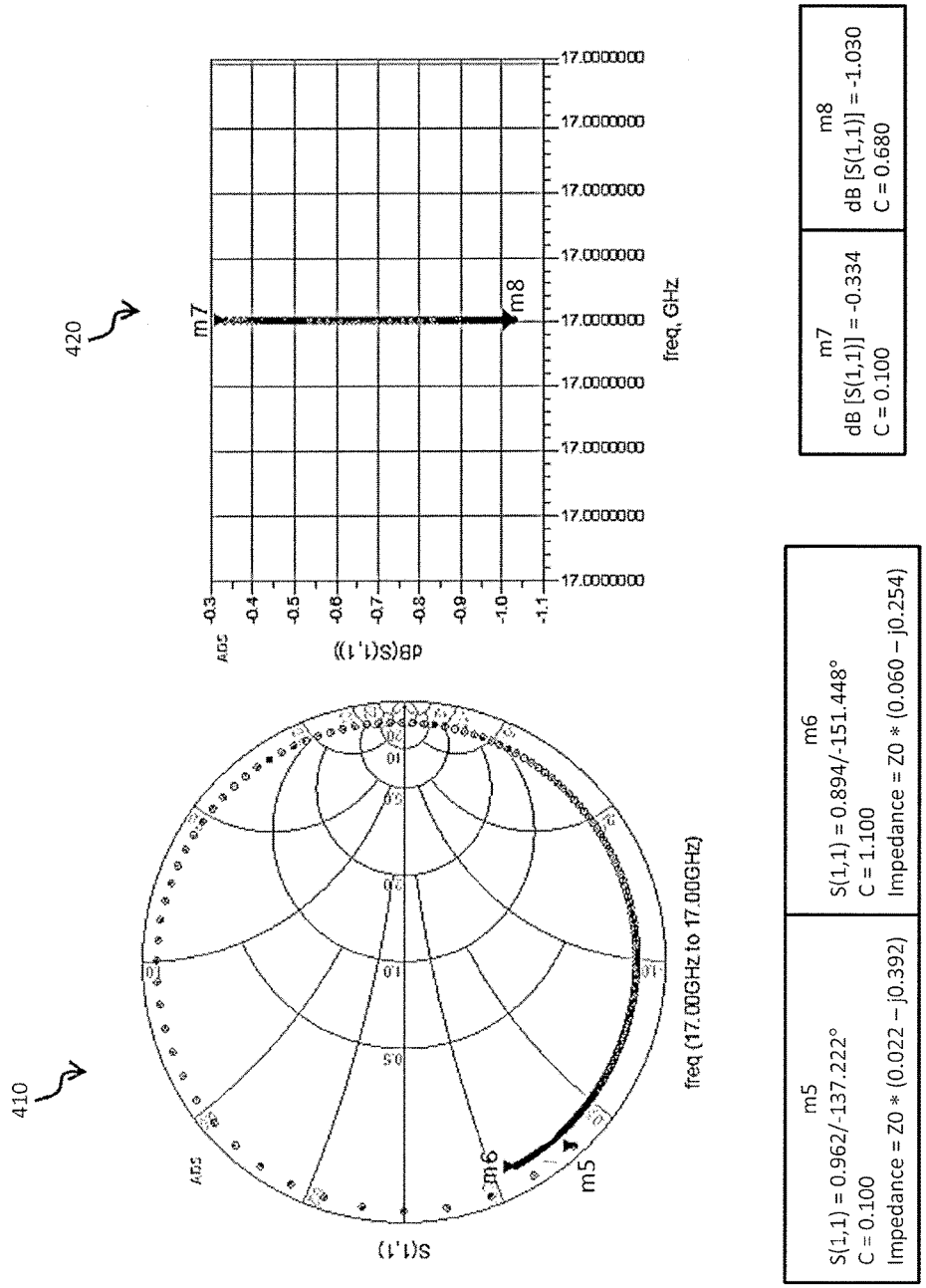
FIGS. 4A and 4B diagrams of phase ranges and signal loss achieved by the hybrid-analog phase shifter by reducing the frequency of the input RF signal, according to one embodiment.

FIG. 4A is a diagram of a phase range and signal loss achieved by the hybrid-analog phase shifter by reducing the frequency of the input RF signal. The phase range plot 410 and corresponding signal loss plot 420 show that the input RF signal has been decreased to a frequency of 17.00 GHz. Furthermore, the quadrature hybrid is still configured to incorporate ideal transmission lines, and the voltage controller 126 supplies the same control voltage $V_c$ to the varactors 120, 122, 124 in order to vary their junction capacitance from C=0.100 pF to 1.100 pF. At point m5, the junction capacitance is C=0.100 pF, and a phase shift of −137.222° is achieved. As the control voltage $V_c$ is adjusted to achieve a junction capacitance of C=1.100 pF at point m6, the phase shift continuously changes clockwise to a final value of −151.448°. As further illustrated in the signal loss plot 420, the signal loss within the phase shift range varies from −0.334 dB at point m7 to −1.030 dB at point m8.

According to the illustrated embodiment, some overlap now exists in the phase range resulting from the 17.00 GHz input RF signal. This overlap accounts over a phase range of approximately 14°. When the desired phase shift falls within the overlapping range, it is possible to select the control voltage which results in lower signal loss. Referring to the phase range plot 430, for example, it can be seen that if the desired phase shift falls within the overlapping range (i.e., −137° to −151°), then capacitance values that are closer to m5 would result in lower signal loss.

Figure 4B:
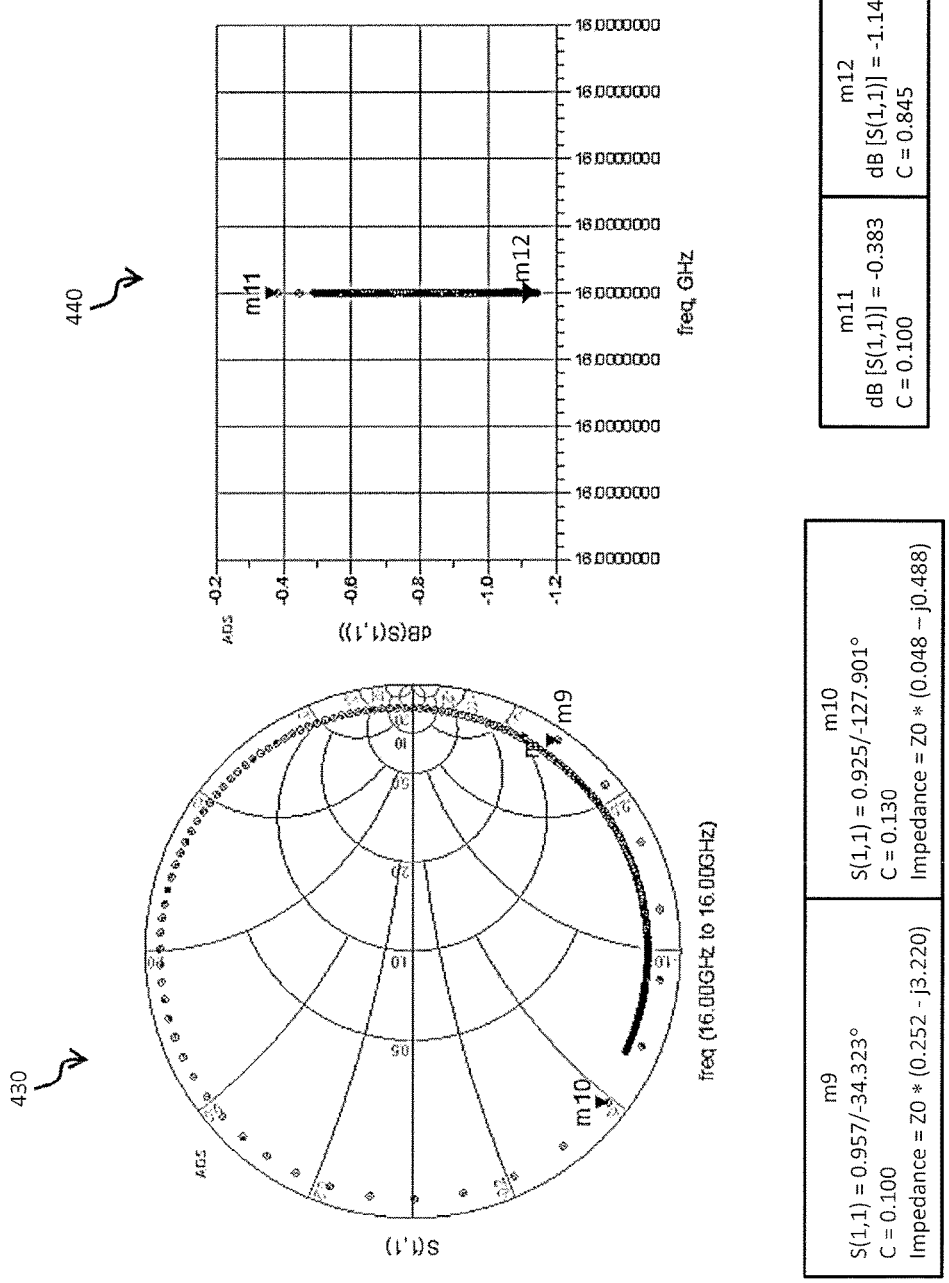

FIG. 4B is a diagram of a phase range and signal loss achieved by the hybrid-analog phase shifter by further reducing the frequency of the input RF signal. The phase range plot 430 and corresponding signal loss plot 440 show that the input RF signal has been decreased to a frequency of 16.00 GHz. Furthermore, the quadrature hybrid is still configured to incorporate ideal transmission lines, and the voltage controller 126 supplies the same control voltage $V_c$ to the varactors 120, 122, 124 in order to vary their junction capacitance from C=0.100 pF to 1.100 pF. At point m9, the junction capacitance is controlled to C=0.100 pF, and a phase shift of −34.323° is achieved. As the control voltage $V_c$ is adjusted to achieve a junction capacitance of C=1.100 pF at point m10, the phase shift continuously changes clockwise to a final value of −127.901°. As further illustrated in the signal loss plot 440, the signal loss within the phase shift range varies from −0.383 dB at point m11 to −1.144 dB at point m12.

As seen in FIG. 4B, the overlap in the phase range has increased as a result of reducing the frequency of the input RF signal to 16.00 GHz. This overlap accounts for a phase range of approximately 94°. When the desired phase shift falls within the overlapping range, it is possible to select the control voltage which results in lower signal loss. Referring to the phase range plot 430, for example, it can be seen that if the desired phase shift falls within the overlapping range (i.e., −34° to −128°), then capacitance values that are closer to m9 would result in lower signal loss.

Figure 4C:
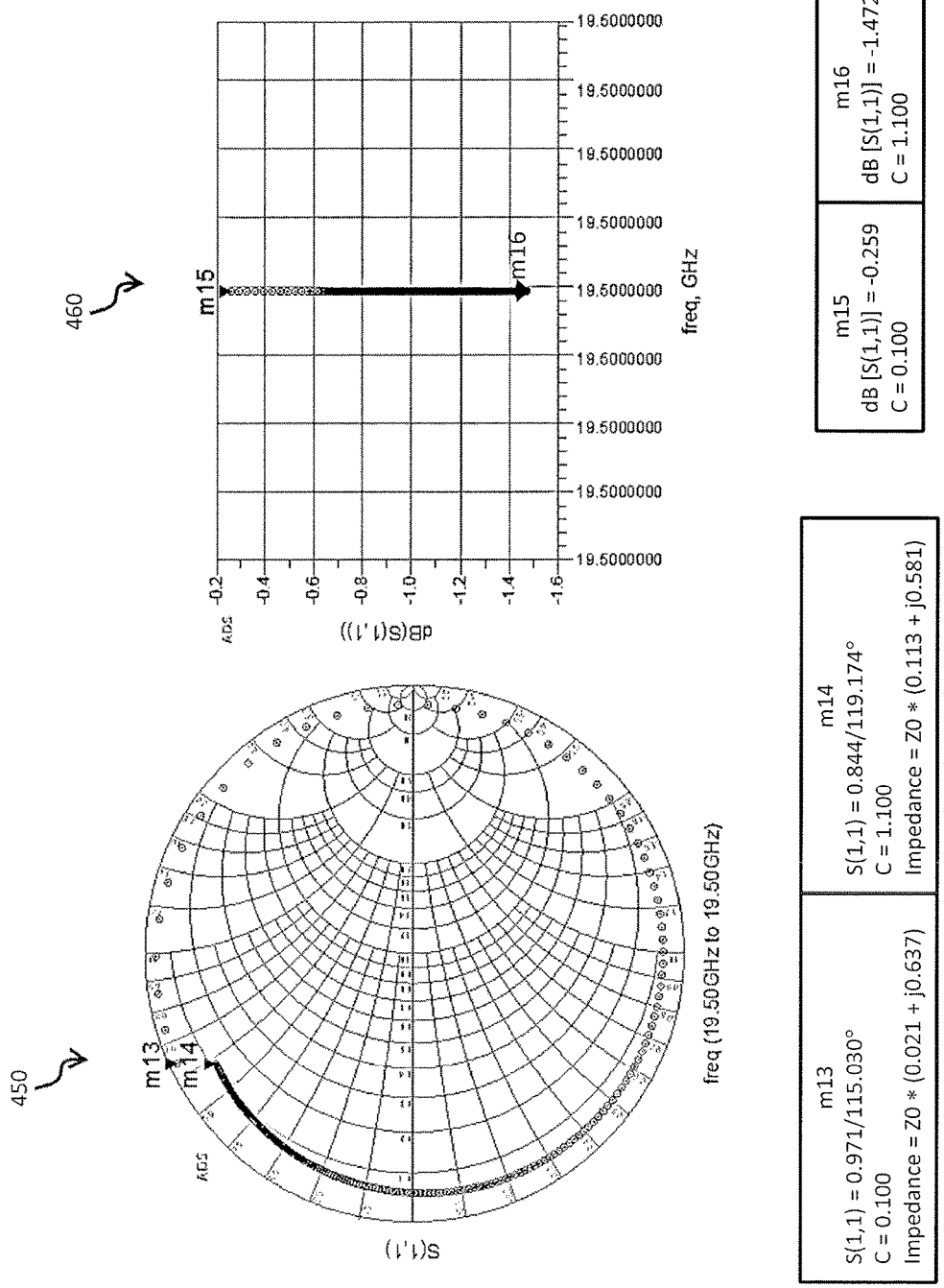
FIGS. 4C and 4D diagrams of phase ranges and signal loss achieved by the hybrid-analog phase shifter by increasing the frequency of the input RF signal, according to one embodiment.

FIG. 4C is a diagram of a phase range and signal loss achieved by the hybrid-analog phase shifter by increasing the frequency of the input RF signal. The phase range plot 450 and corresponding signal loss plot 460 show that the input RF signal has been increased to a frequency of 19.50 GHz. The quadrature hybrid incorporates ideal transmission lines, and the voltage controller 126 supplies the same control voltage $V_c$ to the varactors 120, 122, 124 in order to vary their junction capacitance from C=0.100 pF to 1.100 pF. At point m13, the junction capacitance is C=0.100 pF, and a phase shift of 115.030° is achieved. As the control voltage $V_c$ is adjusted to achieve a junction capacitance of C=1.100 pF at point m14, the phase shift continuously changes clockwise to a final value of 119.174°. As further illustrated in the signal loss plot 460, the signal loss varies from −0.259 dB at point m15 to −1.472 dB at point m16. According to the illustrated embodiment, a 5° gap exists in the phase range resulting from the 19.50 GHz input RF signal. Thus, while increasing the frequency of the input RF signal increases the phase shift range, a gap will still exist.

Figure 4D:
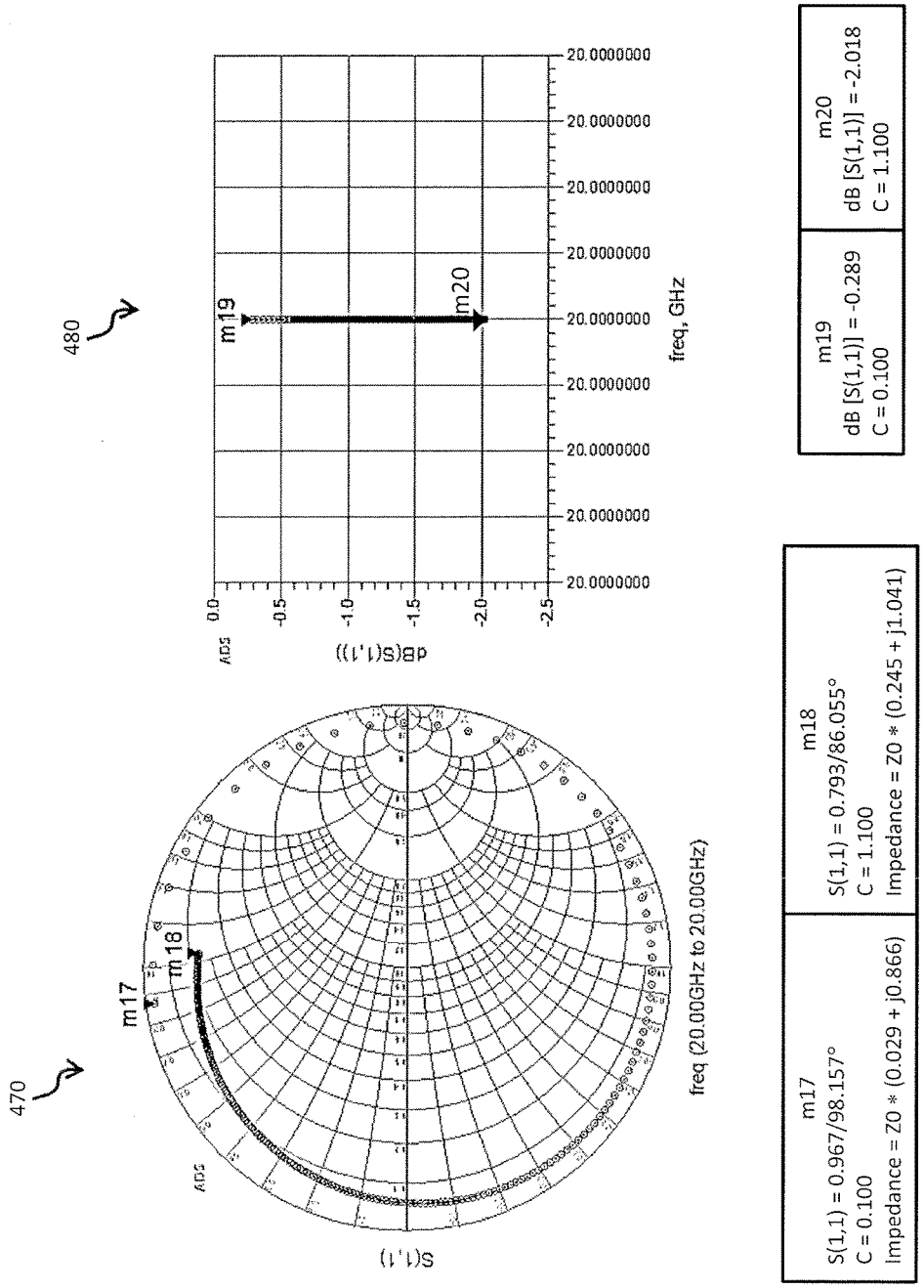

FIG. 4D is a diagram of a phase range plot 470 and signal loss plot 480 achieved by further increasing the frequency of the input RF signal to 20.00 GHz. The quadrature hybrid incorporates ideal transmission lines, and the voltage controller 126 supplies the same control voltage $V_c$ to the varactors 120, 122, 124 in order to vary their junction capacitance from C=0.100 pF to 1.100 pF. At point m17, the junction capacitance is C=0.100 pF, and a phase shift of 98.157° is achieved. As the control voltage $V_c$ is adjusted to achieve a junction capacitance of C=1.100 pF at point m18, the phase shift continuously changes clockwise to a final value of 86.055°. As further illustrated in the signal loss plot 480, the signal loss within the phase shift range varies from −0.289 dB at point m19 to −2.018 dB at point m20. As seen in the figure, an overlap of approximately 90° is produced by increasing the frequency of the input RF signal to 20.00 GHz. Accordingly, when the desired phase shift falls within the overlapping range, it is possible to select the control voltage which results in lower signal loss.

While FIGS. 3 and 4A-4D illustrate phase shift ranges utilizing an input RF signal having a frequency of 16.00 GHz, 17.00 GHz, 18.00 GHz, 19.50 GHz, and 20.00 GHz, it should be noted that the input RF signal is in no way limited to such frequencies. As further illustrated, the overlap in phase rage can be achieved by either increasing or decreasing the frequency of the input RF signal. However, the overlap achieved by decreasing the frequency results in lower signal loss. Depending on the specific implementation, however, an increased frequency may be desired. As previously discussed, various embodiments can provide for varying the amount of overlap (i.e., or total phase range) by adjusting the characteristic impedance of the quadrature hybrid, utilizing analog shifters with lower junction capacitance, incorporating parallel varactors within the analog shifters, etc. Desired frequency shifts can then be selected based on the control voltage which results in the lower signal loss within the overlapping region.

Figure 5:
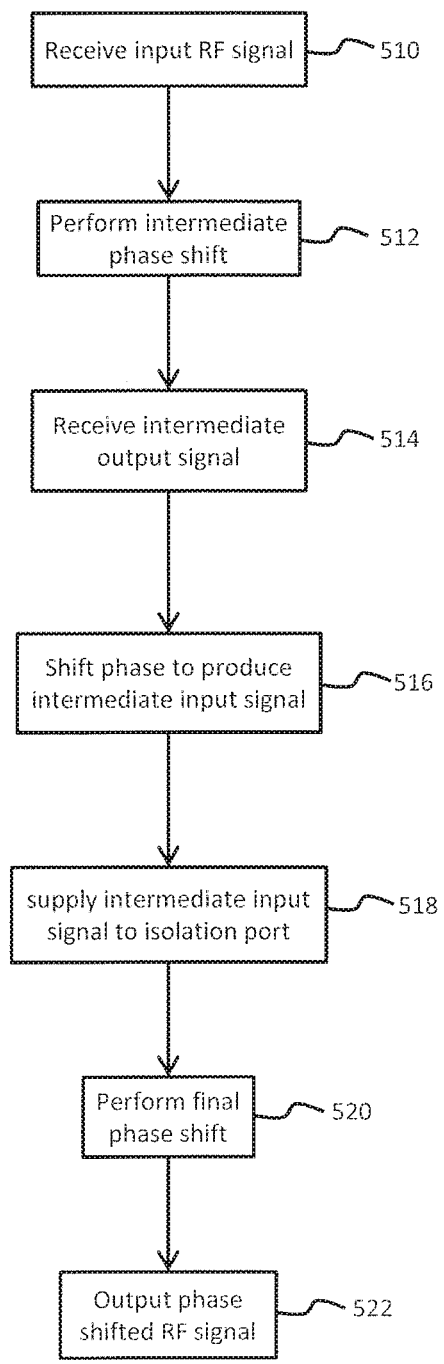
FIG. 5 is a flowchart of a process for shifting the phase of an input signal, according to one embodiment.

FIG. 5 is a flowchart of a process for shifting the phase of an input signal, according to one embodiment. At 510, an input RF signal is received by the hybrid-analog phase shifter. As previously discussed, the input RF signal can be received at the input/output port of the quadrature hybrid. At 512, an intermediate phase shift is performed. According to at least one embodiment, the intermediate phase shift corresponds to the combined phase shifts produced by the first analog shifter and the second analog shifter. The intermediate phase shift is also variable due to the analog phase shifters' ability to continually adjust the phase of the signal based on an applied control voltage. More particularly, the first and second analog shifters can be in the form of varactors that are capable of changing their bias capacitance, based on the control voltage, to vary the amount of phase shift applied to the input RF signal.

At 514, the signals resulting from the intermediate phase shift are received as an intermediate output signal. This can occur, for example, at the isolation port of the quadrature hybrid. Although the intermediate phase shift is performed at 512, it should be noted that additional phase shifts occur as the signals from the first and second analog shifters travel from the through port and coupled port out to the isolation port. At 516, the phase of the intermediate output signal received at the isolation port is shifted in order to produce an intermediate input signal. The phase shift performed on the intermediate output signal can be performed, for example, by a third analog shifter. Accordingly, this phase shift is variable based, at least in part, on the control voltage supplied to the third analog shifter. According to at least one embodiment, the third analog shifter can receive the same control voltage as the first and second analog shifters. According to other embodiments, however, a different control voltage can be supplied to the third analog shifter.

At 518, the intermediate input signal is supplied to the isolation port as an input. The intermediate input signal travels through the quadrature hybrid, and is output at the through port and the coupled port. A final phase shift is performed on the signals received at the through and coupled ports at 520. As previously discussed, signals supplied to the quadrature hybrid as an input split such that a first portion would be output, for example, at the through port and a second portion would be output at the coupled port. The final phase shift is performed on the two portions of the signal by the first analog shifter and the second analog shifter. According to at least one embodiment, the same control voltage that was applied to perform the intermediate phase shift is applied to perform the final phase shift. The resulting signals are then supplied as inputs to the through port and the coupled port. At 522, a phase shifted RF signal is output. This corresponds, for example, to the input/output port receiving the signals resulting from the final phase shift.

Figure 6:
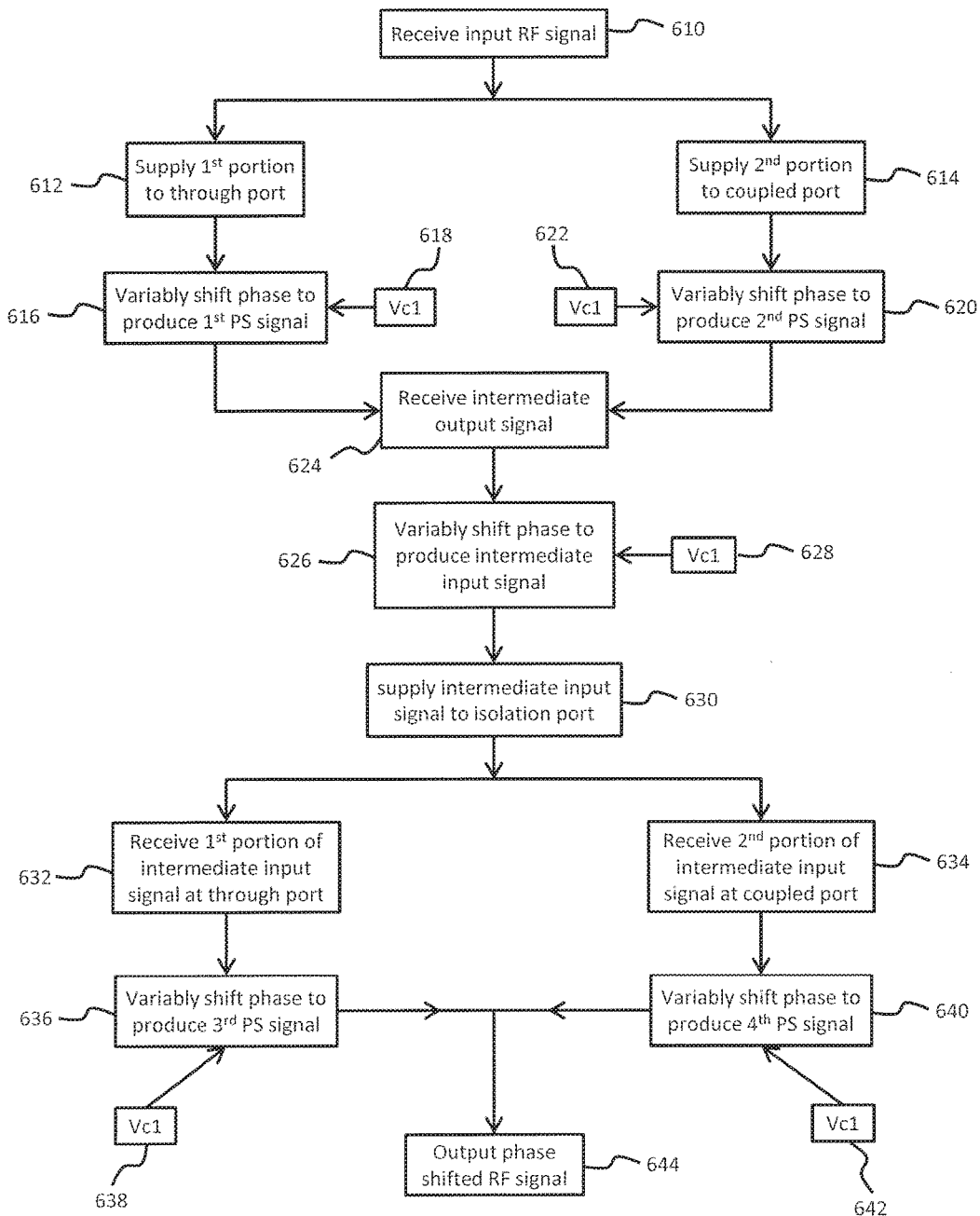
FIG. 6 is a flowchart of a process for shifting the phase of an input signal according to at one or more embodiments.

FIG. 6 is a flowchart of a process for shifting the phase of an input signal according to at one or more embodiments. At 610, an input RF signal is received by the hybrid-analog phase shifter. This can occur, for example, at the input/output port of the quadrature hybrid. The input RF signal is then split into two portions. At 612, the first portion of the input RF signal is supplied to the through port. At 614, the second portion of the input RF signal is supplied to the coupled port. At 616, the phase of the first portion of the input RF signal is shifted in order to produce a first phase shifted signal. This can be done, for example, by the first analog shifter. As illustrated in FIG. 6, the amount of phase shift produced by the first analog shifter can vary depending on a control voltage that is applied at 618. At 620, the phase of the second portion of the input RF signal is variably shifted in order to produce a second phase shifted signal. More particularly, a second analog shifter can be utilized to variably shift the phase of the second portion of the input RF signal based on a control voltage supplied at 622. According to various embodiments, the second analog shifter can receive the same voltage as the first analog shifter. Furthermore, a separate controller can be used to supply the control voltage to the second analog shifter.

At 624, and intermediate output signal is received at the isolation port of the quadrature hybrid. According to various embodiments, the first phase shifted signal is supplied as an input to the through port of the quadrature hybrid, while the second phase shifted signal is supplied to the coupled port of the quadrature hybrid. The first and second phase shifted signals travel through the quadrature hybrid and are received at the isolation port. As previously discussed, the quadrature hybrid contains various phase delay loads. Thus, additional phase shifts occur as the first and second phase shifted signals travel to the isolation port.

At 626, the phase of the intermediate output signal is variably shifted by the third analog shifter in order to produce an intermediate input signal. According to various embodiments, the third analog shifter can be controlled to provide the same amount of phase shift as the first and second analog shifters. This can be accomplished by supplying the same control voltage to the third analog shifter. All three analog shifters, therefore, would receive identical control voltages. According to other embodiments, however, a second (or different) control voltage can be separately supplied to the third analog shifter at 628. Additionally, a separate controller can be used to generate and supply the second control voltage to the third analog shifter.

At 630, the intermediate input signal is supplied to the isolation port. The intermediate input signal is subsequently split into two portions. At 632, the first portion of the intermediate input signal is received at the through port. At 634, the second portion of the intermediate input signal is received at the coupled port. At 636, the first analog shifter variably shifts the phase of the first portion of the intermediate input signal in order to produce a third phase shifted signal. As further illustrated in FIG. 6, a control voltage is applied to the first analog shifter at 638 in order achieve the desired phase shift. According to at least one embodiment, the control voltage applied at 638 corresponds to the same control voltage that was applied at 618 to produce the first phase shifted signal. Thus, the amount of phase change generated at 636 would be equal to the amount of phase change generated at 616.

At 640, the second analog shifter variably shifts the second portion of the intermediate input signal to produce a fourth phase shifted signal. Depending on the specific implementation, the control voltage applied to the second analog shifter can be the same as, or different from, the control voltage applied to the first analog shifter. The control voltage applied to the second analog shifter at 642 can also correspond to the control voltage supplied to the second analog shifter at 620 when generating the second phase shifted signal. According to various embodiments, however, it is possible to provide a different control voltage to the second analog shifter at 642 when producing the fourth phase shifted signal. For example, a first control voltage (Vc) can be supplied to the first analog shifter at 618 and to the second analog shifter at 622. A different control voltage, however can be supplied to the first analog shifter at 632 and to the second analog shifter at 642. Thus, the first and second analog shifters would receive a first voltage to produce the first and second phase shifted signals, and a second voltage to produce the third and fourth phase shifted signals.

As illustrated in FIG. 6, the third phase shifted signal and the fourth phase shifted signal are respectively supplied to the through port and coupled port of the quadrature hybrid. Furthermore, the third and fourth phase shifted signals are subjected to additional phase shifts by the phase delay loads contained within the quadrature hybrid. At 644, a phase shifted RF signal is output at the input/output port. The phase shifted RF signal corresponds to the combined third and fourth phase shifted signals that are received at the input/output port.

Various features described herein may be implemented via software, hardware (e.g., general processor, Digital Signal Processing (DSP) chip, an Application Specific Integrated Circuit (ASIC), Field Programmable Gate Arrays (FPGAs), etc.), firmware or a combination thereof. For example, such hardware can be interfaced to supply the control voltages to the analog shifters, or to control various features of the voltage controllers. Depending on the implementation, such hardware can be used to supply, or enable various circuitry to supply, different control voltages to the first analog shifter, the second analog shifter, the third analog shifter, or any combination thereof. Such hardware can also be configured to monitor overall operation of the system in order to generate or modify voltage profiles for achieving particular phase shifts or for switching between different phases. Additionally, such hardware can be used to analyze input frequencies and overlapping phase ranges in order to select the control voltages that will achieve the desired phase shifts while minimizing signal loss.

The terms software, computer software, computer program, program code, and application program may be used interchangeably and are generally intended to include any sequence of machine or human recognizable instructions intended to program/configure a computer, processor, server, etc. to perform one or more functions. Such software can be rendered in any appropriate programming language or environment including, without limitation: C, C++, C#, Python, R, Fortran, COBOL, assembly language, markup languages (e.g., HTML, SGML, XML, VoXML), Java, JavaScript, etc. As used herein, the terms processor, microprocessor, digital processor, and CPU are meant generally to include all types of processing devices including, without limitation, single/multi-core microprocessors, digital signal processors (DSPs), reduced instruction set computers (RISC), general-purpose (CISC) processors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components. Such exemplary hardware for implementing the described features are detailed below.

Figure 7:
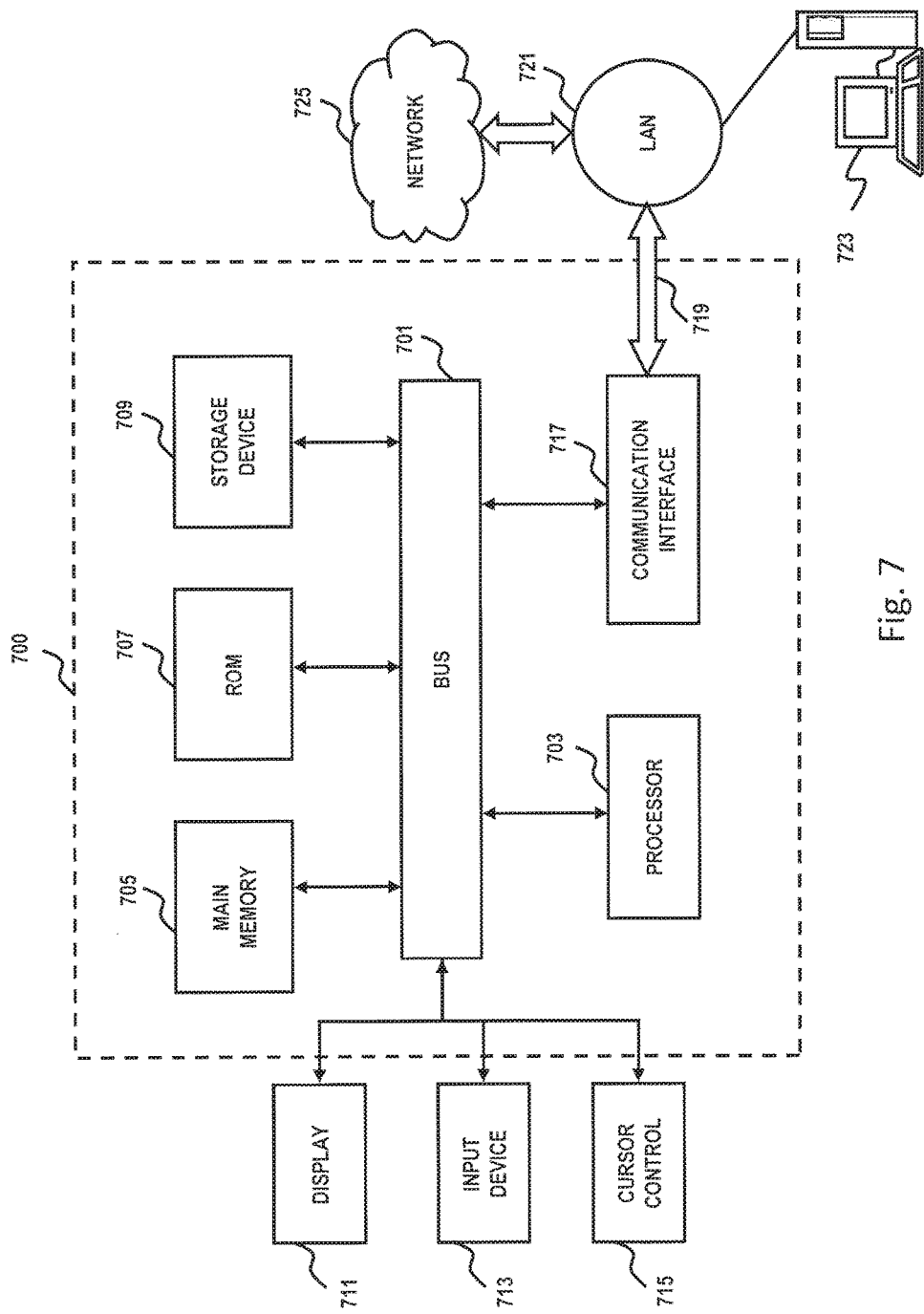
FIG. 7 is a diagram of a computer system that can be used to implement various exemplary embodiments.

FIG. 7 is a diagram of a computer system that can be used to implement various embodiments. The computer system 700 includes a bus 701 or other communication mechanism for communicating information and a processor 703 coupled to the bus 701 for processing information. The computer system 700 also includes main memory 705, such as a random access memory (RAM), dynamic random access memory (DRAM), synchronous dynamic random access memory (SDRAM), double data rate synchronous dynamic random-access memory (DDR SDRAM), DDR2 SDRAM, DDR3 SDRAM, DDR4 SDRAM, etc., or other dynamic storage device (e.g., flash RAM), coupled to the bus 701 for storing information and instructions to be executed by the processor 703. Main memory 705 can also be used for storing temporary variables or other intermediate information during execution of instructions by the processor 703. The computer system 700 may further include a read only memory (ROM) 707 or other static storage device coupled to the bus 701 for storing static information and instructions for the processor 703. A storage device 709, such as a magnetic disk or optical disk, is coupled to the bus 701 for persistently storing information and instructions.

The computer system 700 may be coupled via the bus 701 to a display 711, such as a light emitting diode (LED) or other flat panel displays, for displaying information to a computer user. An input device 713, such as a keyboard including alphanumeric and other keys, is coupled to the bus 701 for communicating information and command selections to the processor 703. Another type of user input device is a cursor control 715, such as a mouse, a trackball, or cursor direction keys, for communicating direction information and command selections to the processor 703 and for controlling cursor movement on the display 711. Additionally, the display 711 can be touch enabled (i.e., capacitive or resistive) in order facilitate user input via touch or gestures.

According to an exemplary embodiment, the processes described herein are performed by the computer system 700, in response to the processor 703 executing an arrangement of instructions contained in main memory 705. Such instructions can be read into main memory 705 from another computer-readable medium, such as the storage device 709. Execution of the arrangement of instructions contained in main memory 705 causes the processor 703 to perform the process steps described herein. One or more processors in a multiprocessing arrangement may also be employed to execute the instructions contained in main memory 705. In alternative embodiments, hard-wired circuitry may be used in place of or in combination with software instructions to implement exemplary embodiments. Thus, exemplary embodiments are not limited to any specific combination of hardware circuitry and software.

The computer system 700 also includes a communication interface 717 coupled to bus 701. The communication interface 717 provides a two-way data communication coupling to a network link 719 connected to a local network 721. For example, the communication interface 717 may be a digital subscriber line (DSL) card or modem, an integrated services digital network (ISDN) card, a cable modem, fiber optic service (FiOS) line, or any other communication interface to provide a data communication connection to a corresponding type of communication line. As another example, communication interface 717 may be a local area network (LAN) card (e.g. for Ethernet™ or an Asynchronous Transfer Mode (ATM) network) to provide a data communication connection to a compatible LAN. Wireless links can also be implemented. In any such implementation, communication interface 717 sends and receives electrical, electromagnetic, or optical signals that carry digital data streams representing various types of information. Further, the communication interface 717 can include peripheral interface devices, such as a Universal Serial Bus (USB) interface, a High Definition Multimedia Interface (HDMI), etc. Although a single communication interface 717 is depicted in FIG. 7, multiple communication interfaces can also be employed.

The network link 719 typically provides data communication through one or more networks to other data devices. For example, the network link 719 may provide a connection through local network 721 to a host computer 723, which has connectivity to a network 725 such as a wide area network (WAN) or the Internet. The local network 721 and the network 725 both use electrical, electromagnetic, or optical signals to convey information and instructions. The signals through the various networks and the signals on the network link 719 and through the communication interface 717, which communicate digital data with the computer system 700, are exemplary forms of carrier waves bearing the information and instructions.

The computer system 700 can send messages and receive data, including program code, through the network(s), the network link 719, and the communication interface 717. In the Internet example, a server (not shown) might transmit requested code belonging to an application program for implementing an exemplary embodiment through the network 725, the local network 721 and the communication interface 717. The processor 703 may execute the transmitted code while being received and/or store the code in the storage device 709, or other non-volatile storage for later execution. In this manner, the computer system 700 may obtain application code in the form of a carrier wave.

The term "computer-readable medium" as used herein refers to any medium that participates in providing instructions to the processor 703 for execution. Such a medium may take many forms, including but not limited to non-volatile media, volatile media, and transmission media. Non-volatile media include, for example, optical or magnetic disks, such as the storage device 709. Non-volatile media can further include flash drives, USB drives, microSD cards, etc. Volatile media include dynamic memory, such as main memory 705. Transmission media include coaxial cables, copper wire and fiber optics, including the wires that comprise the bus 701. Transmission media can also take the form of acoustic, optical, or electromagnetic waves, such as those generated during radio frequency (RF) and infrared (IR) data communications. Common forms of computer-readable media include, for example, a USB drive, microSD card, hard disk drive, solid state drive, optical disk (e.g., DVD, DVD RW, Blu-ray), or any other medium from which a computer can read.

Figure 8:
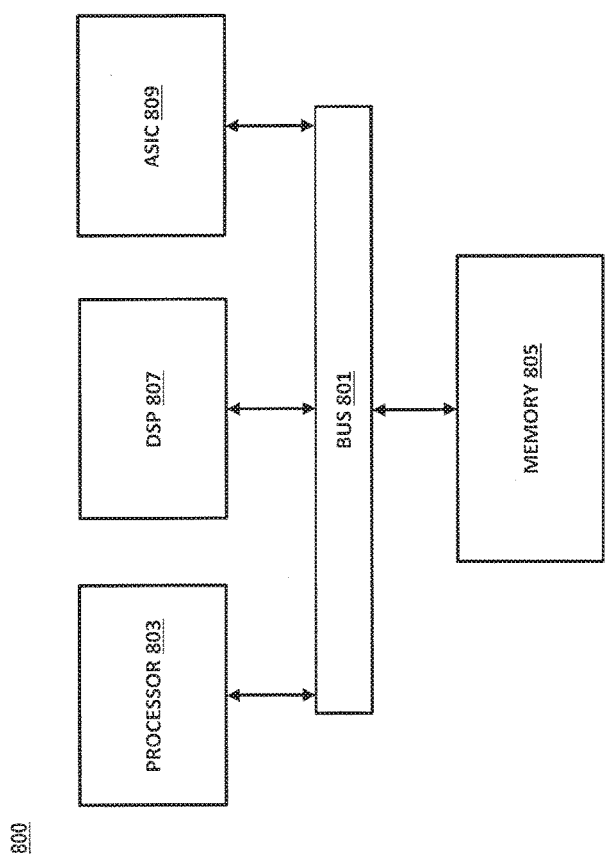
FIG. 8 is a diagram of a chip set that can be used to implement various exemplary embodiments.

FIG. 8 illustrates a chip set 800 upon which an embodiment of the invention may be implemented. Chip set 800 is programmed to implement various features as described herein and includes, for instance, the processor and memory components described with respect to FIG. 8 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 800, or a portion thereof, constitutes a means for performing one or more steps of the figures.

In one embodiment, the chip set 800 includes a communication mechanism such as a bus 801 for passing information among the components of the chip set 800. A processor 803 has connectivity to the bus 801 to execute instructions and process information stored in, for example, a memory 805. The processor 803 may include one or more processing cores with each core configured to perform independently. A multi-core processor enables multiprocessing within a single physical package. Examples of a multi-core processor include two, four, eight, or greater numbers of processing cores. Alternatively or in addition, the processor 803 may include one or more microprocessors configured in tandem via the bus 801 to enable independent execution of instructions, pipelining, and multithreading. The processor 803 may also be accompanied with one or more specialized components to perform certain processing functions and tasks such as one or more digital signal processors (DSP) 807, or one or more application-specific integrated circuits (ASIC) 809. A DSP 807 typically is configured to process real-world signals (e.g., sound) in real time independently of the processor 803. Similarly, an ASIC 809 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 803 and accompanying components have connectivity to the memory 805 via the bus 801. The memory 805 includes both dynamic memory (e.g., RAM, magnetic disk, re-writable optical disk, etc.) and static memory (e.g., ROM, CD-ROM, DVD, BLU-RAY disk, etc.) for storing executable instructions that when executed perform the inventive steps described herein to controlling a set-top box based on device events. The memory 805 also stores the data associated with or generated by the execution of the inventive steps.

While certain exemplary embodiments and implementations have been described herein, other embodiments and modifications will be apparent from this description. Accordingly, the various embodiments described are not intended to be limiting, but rather are encompassed by the broader scope of the presented claims and various obvious modifications and equivalent arrangements.

What is claimed is:

1. A method comprising:
   receiving an input radio frequency (RF) signal from an external source at an input/output port of a quadrature hybrid;
   performing an intermediate phase shift of the input RF signal using a first analog shifting unit;
   receiving, at an isolation port of the quadrature hybrid, an intermediate output signal based, at least in part, on the intermediate phase shift;
   shifting a phase of the intermediate output signal within a predetermined range to produce an intermediate input signal using an additional analog shifting unit connected to the isolation port of the quadrature hybrid;
   supplying the intermediate input signal to the isolation port of the quadrature hybrid;
   performing a final phase shift of the intermediate input signal using the first analog shifting unit; and
   outputting, at the input/output port, a phase shifted RF signal corresponding to the final phase shifted intermediate input signal,
   wherein the intermediate phase shift and the final phase shift are variable within a predetermined range.

2. The method of claim 1, wherein performing an intermediate phase shift comprises:
   supplying a first portion of the input RF signal to a through port of the quadrature hybrid;
   supplying a second portion of the input RF signal to a coupled port of the quadrature hybrid;
   variably shifting a phase of the first portion of the input RF signal within a predetermined range to produce a first phase shifted signal using a first analog shifter; and
   variably shifting a phase of the second portion of the input RF signal within a predetermined range to produce a second phase shifted signal using a second analog shifter.

3. The method of claim 2, wherein receiving an intermediate output signal comprises receiving the first and second phase shifted signals as the intermediate output signal at the isolation port of the quadrature hybrid.

4. The method of claim 1, wherein performing a final phase shift comprises:
receiving a first portion of the intermediate input signal at the through port;
receiving a second portion of the intermediate input signal at the coupled port;
variably shifting a phase of the first portion of the intermediate input signal within a predetermined range to produce a third phase shifted signal using a first analog shifter; and
variably shifting a phase of the second portion of the intermediate input signal within a predetermined range to produce a fourth phase shifted signal using a second analog shifter.

5. The method of claim 1, wherein the first analog shifting unit comprises:
a first varactor connected to a through port of the quadrature hybrid for shifting a phase of a first portion of the input RF signal; and
a second varactor connected to a coupled port of the quadrature hybrid for shifting a phase of a second portion of the input RF signal.

6. The method of claim 5, wherein the additional analog shifting unit comprises a third varactor.

7. The method of claim 6, further comprising supplying a control voltage to the first varactor, the second varactor, and the third varactor.

8. The method of claim 6, further comprising:
supplying a first control voltage to the first varactor and the second varactor; and
supplying a second control voltage to the third varactor, wherein the first control voltage and the second control voltage are different from each other.

9. The method of claim 1, wherein the total signal loss of the phase shifted RF signal is less than −1.5 dB.

10. The method of claim 1, wherein the total signal loss of the phase shifted RF signal ranges from −0.38 to −1.15 dB.

11. The method of claim 1, wherein the total phase range of the phase shifted RF signal is continuously variable over at least 345°.

12. The method of claim 1, wherein the total phase range of the phase shifted RF signal is continuously variable over a range of 345°-375°.

13. An apparatus comprising:
a quadrature hybrid having an input/output port configured, in part, for receiving an input radio frequency (RF) signal from an external source and outputting a phase shifted RF signal;
an analog shifting unit connected to the quadrature hybrid for performing an intermediate phase shift on the input RF signal within a predetermined range; and
an additional analog shifting unit connected to an isolation port of the quadrature hybrid, the additional analog shifting unit being configured for:
receiving, at the isolation port of the quadrature hybrid, an intermediate output signal based, at least in part, on the intermediate phase shift,
shifting a phase of the intermediate output signal received at the isolation port within a predetermined range to produce an intermediate input signal, and
supplying the intermediate input signal to the isolation port of the quadrature hybrid,
wherein the analog shifting unit is configured to perform a final phase shift of the intermediate input signal within a predetermined range, and
wherein the final phase shifted intermediate input signal is output, at the input/output port, as the phase shifted RF signal.

14. The apparatus of claim 13, wherein the analog shifting unit comprises:
a first analog shifter, connected to a through port of the quadrature hybrid, for performing a portion of the intermediate phase shift by variably shifting a first portion of the input RF signal, received at the through port, within a predetermined range to produce a first phase shifted signal; and
a second analog shifter, connected to a coupled port of the quadrature hybrid, for performing a portion of the intermediate phase shift by variably shifting a second portion of the input RF signal, received at the coupled port, within a predetermined range to produce a second phase shifted signal.

15. The apparatus of claim 14, wherein the first phase shifted signal and second phase shifted signal are received as the intermediate output signal at the isolation port of the quadrature hybrid.

16. The apparatus of claim 13, wherein the analog shifting unit comprises:
a first analog shifter, connected to a through port of the quadrature hybrid, for performing a portion of the final phase shift by variably shifting a first portion of the intermediate input signal, received at the through port, within a predetermined range to produce a third phase shifted signal; and
a second analog shifter, connected to a coupled port of the quadrature hybrid, for performing a portion of the final phase shift by variably shifting a second portion of the intermediate input signal, received at the coupled port, within a predetermined range to produce a fourth phase shifted signal.

17. The apparatus of claim 13, wherein the first analog shifting unit comprises:
a first varactor connected to a through port of the quadrature hybrid for shifting a phase of a first portion of the input RF signal; and
a second varactor connected to a coupled port of the quadrature hybrid for shifting a phase of a second portion of the input RF signal.

18. The apparatus of claim 17, wherein the additional analog shifting unit comprises a third varactor.

19. The apparatus of claim 18, further comprising a voltage controller for supplying a control voltage to the first varactor, the second varactor, and the third varactor.

20. The apparatus of claim 18, further comprising:
a first voltage controller for supplying a first control voltage to the first varactor and the second varactor; and
a second voltage controller for supplying a second control voltage to the third varactor,
wherein the first control voltage and the second control voltage are different from each other.

21. The apparatus of claim 13, wherein the total signal loss of the phase shifted RF signal is less than −1.5 dB.

22. The apparatus of claim 13, wherein the total signal loss of the phase shifted RF signal ranges from −0.38 to −1.15 dB.

23. The apparatus of claim 13, wherein the total phase range of the phase shifted RF signal is continuously variable over at least 345°.

24. The apparatus of claim 13, wherein the total phase range of the phase shifted RF signal is continuously variable over a range of 345°-375°.

\* \* \* \* \*